United States Patent
Lee et al.

(10) Patent No.: US 9,728,935 B2
(45) Date of Patent: Aug. 8, 2017

(54) CHIP-SCALE PACKAGE AND SEMICONDUCTOR DEVICE ASSEMBLY

(71) Applicant: Lumentum Operations LLC, Milpitas, CA (US)

(72) Inventors: Kong Weng Lee, San Jose, CA (US); Vincent V. Wong, Los Altos, CA (US); Jay A. Skidmore, San Jose, CA (US); Jihua Du, Santa Clara, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 14/731,510

(22) Filed: Jun. 5, 2015

(65) Prior Publication Data

US 2016/0359295 A1   Dec. 8, 2016

(51) Int. Cl.
*H01S 3/04* (2006.01)
*H01S 5/022* (2006.01)
*H01S 5/024* (2006.01)

(52) U.S. Cl.
CPC .......... *H01S 5/02272* (2013.01); *H01S 5/022* (2013.01); *H01S 5/02256* (2013.01); *H01S 5/02268* (2013.01); *H01S 5/02476* (2013.01); *H01L 2224/48091* (2013.01); *H01L 2224/48227* (2013.01); *H01L 2224/48464* (2013.01); *H01L 2224/73265* (2013.01); *H01L 2924/16151* (2013.01); *H01L 2924/16152* (2013.01); *H01S 5/02236* (2013.01); *H01S 5/02276* (2013.01); *H01S 5/02296* (2013.01); *H01S 5/02469* (2013.01)

(58) Field of Classification Search
CPC ............. H01S 5/02272; H01S 5/02236; H01S 5/02256; H01S 5/022; H01S 5/02276; H01S 5/02469
See application file for complete search history.

(56) References Cited

U.S. PATENT DOCUMENTS

| | | | |
|---|---|---|---|
| 5,479,029 A * | 12/1995 | Uchida | H01L 33/647 257/103 |
| 5,835,518 A | 11/1998 | Mundinger et al. | 372/50.12 |
| 6,195,376 B1 | 2/2001 | Wilson et al. | 372/50.12 |
| 6,281,096 B1 * | 8/2001 | Ewer | H01L 21/50 257/E21.499 |
| 6,326,646 B1 * | 12/2001 | Baillargeon | B82Y 20/00 257/94 |
| 7,176,058 B2 | 2/2007 | Yoon et al. | 438/110 |
| 8,068,524 B1 * | 11/2011 | Patel | B82Y 20/00 372/34 |
| 8,130,807 B2 | 3/2012 | Schulz-Harder et al. | 372/50.12 |
| 8,475,056 B2 | 7/2013 | Yalamanchili et al. | 385/88 |

(Continued)

FOREIGN PATENT DOCUMENTS

JP   2006032406 A *   2/2006   ............. H01S 5/022

Primary Examiner — Yuanda Zhang
(74) Attorney, Agent, or Firm — Harrity & Harrity, LLP

(57) ABSTRACT

A chip-scale package for an edge-emitting semiconductor device and a semiconductor device assembly including such a chip-scale package are provided. The chip-scale package includes an edge-emitting semiconductor device chip, a top submount disposed on a top surface of the chip, and a bottom submount disposed on a bottom surface of the chip. The top-submount area and the bottom-submount area are each greater than the chip area and less than or equal to about 1.2 times the chip area.

20 Claims, 6 Drawing Sheets

(56) References Cited

U.S. PATENT DOCUMENTS

| | | | |
|---|---|---|---|
| 8,537,873 B2 | 9/2013 | Lee et al. ........................ | 372/99 |
| 9,008,139 B2 | 4/2015 | Monadgemi et al. ..... | 372/44.01 |
| 2005/0087848 A1* | 4/2005 | Yoon ....................... | H01L 21/78 |
| | | | 257/676 |

* cited by examiner

CHIP-SCALE PACKAGE AND SEMICONDUCTOR DEVICE ASSEMBLY

TECHNICAL FIELD

The present disclosure relates to a chip-scale package for a semiconductor device and a semiconductor device assembly including such a chip-scale package. More particularly, the present disclosure relates to a chip-scale package for an edge-emitting semiconductor device and a semiconductor device assembly including such a chip-scale package.

BACKGROUND

A conventional chip-on-submount (COS) package 100 for an edge-emitting laser diode is shown in FIG. 1. The COS package 100 includes an edge-emitting laser diode chip 110 and a submount 120. For example, the submount 120 may be formed of aluminum nitride (AlN), silicon carbide (SiC), or a copper-tungsten alloy (CuW). An anode pad 130 and a cathode pad 131 are defined on the submount 120 by patterned metallization, e.g., gold metallization. A bottom, p-side surface of the chip 110 is attached and electrically connected to the anode pad 130 with solder 140, e.g., a gold-tin (AuSn) solder, and wire bonds 141, e.g., gold wire bonds, are used to electrically connect a top, n-side surface of the chip 110 to the cathode pad 131.

Unfortunately, the area of the COS package 100 is often relatively large, e.g., about 5 mm$^2$, to provide space on the COS package 100 for electrical connections during burn-in and testing. A package having a smaller area would be desirable, especially for mobile applications.

SUMMARY

Accordingly, an aspect of the present disclosure relates to a chip-scale package comprising: an edge-emitting semiconductor device chip, having a chip area, comprising a top surface and an opposite bottom surface; a top submount, having a top-submount area, disposed on the top surface of the chip; and a bottom submount, having a bottom-submount area, disposed on the bottom surface of the chip; wherein the top-submount area and the bottom-submount area are each greater than the chip area and less than or equal to about 1.2 times the chip area.

Another aspect of the present disclosure relates to a semiconductor device assembly comprising: a chip-scale package comprising: an edge-emitting semiconductor device chip, having a chip area, comprising a top surface and an opposite bottom surface; a top submount, having a top-submount area, disposed on the top surface of the chip; and a bottom submount, having a bottom-submount area, disposed on the bottom surface of the chip; wherein the top-submount area and the bottom-submount area are each greater than the chip area and less than or equal to about 1.2 times the chip area; and a printed circuit board (PCB); wherein the chip-scale package is mounted on the PCB so that the top submount and the bottom submount are each electrically connected to the PCB.

BRIEF DESCRIPTION OF THE DRAWINGS

Numerous exemplary embodiments will now be described in greater detail with reference to the accompanying drawings wherein.

DETAILED DESCRIPTION

In an exemplary embodiment, the present disclosure provides a chip-scale package for an edge-emitting semiconductor device chip. A chip-scale package may be defined as a package having a package area that is less than or equal to about 1.2 times a chip area of the semiconductor device chip it contains. In general, a chip-scale package may be advantageous for applications requiring a small form factor, such as mobile applications.

Figure 1:
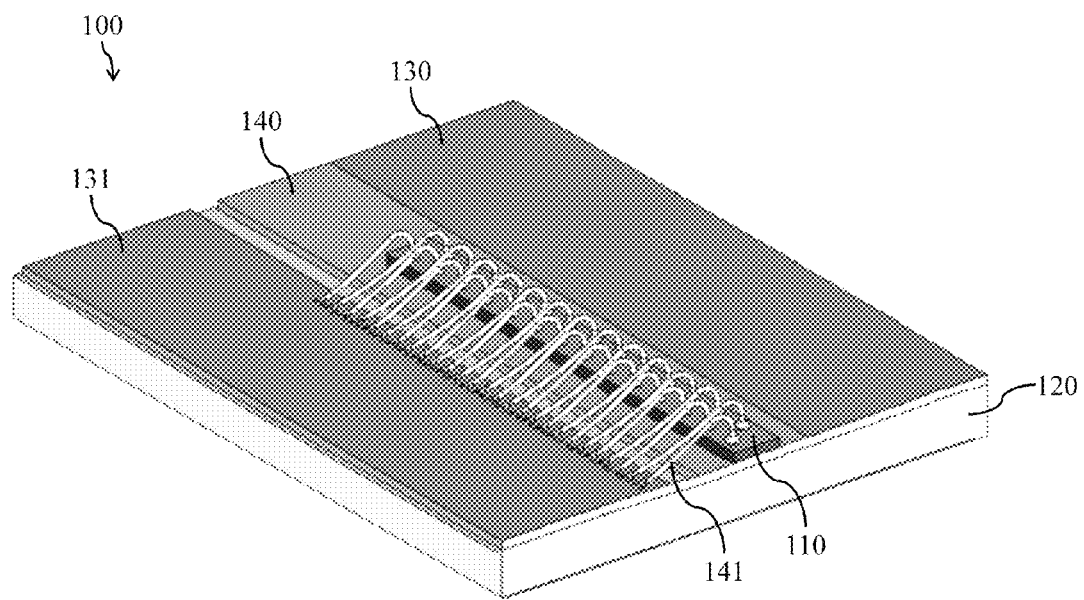
FIG. 1 is a perspective view of a conventional chip-on-submount (COS) package.
Figure 2A:
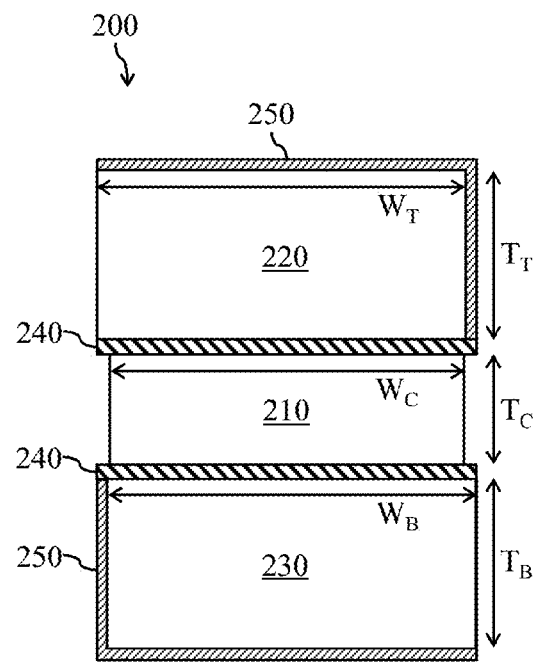
FIG. 2A is a schematic illustration of a front view of a chip-scale package.
Figure 2B:
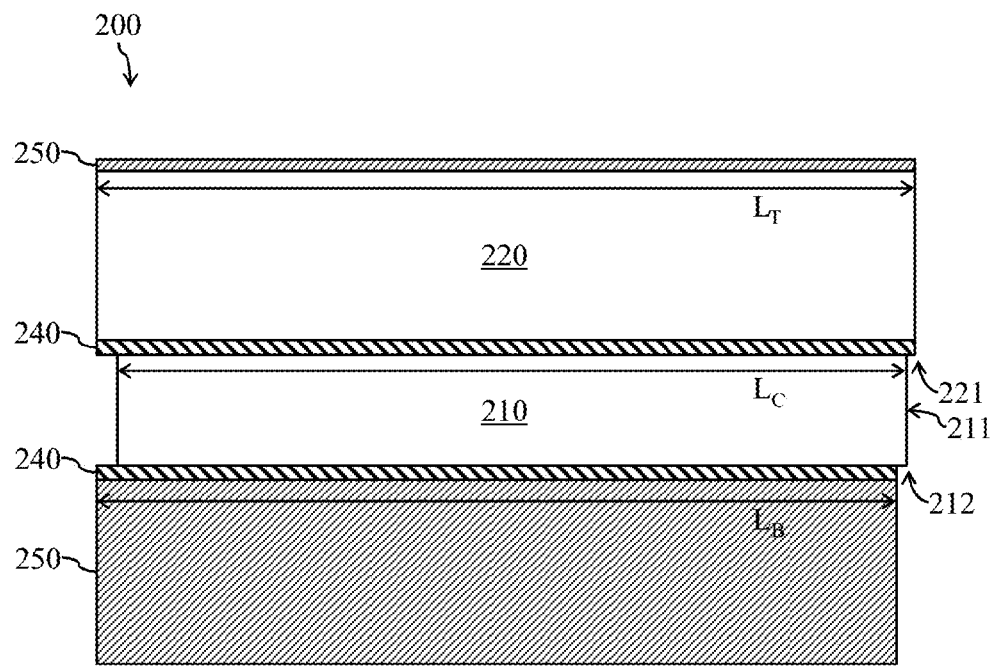
FIG. 2B is a schematic illustration of a side view of the chip-scale package of FIG. 2A.
Figure 3A:
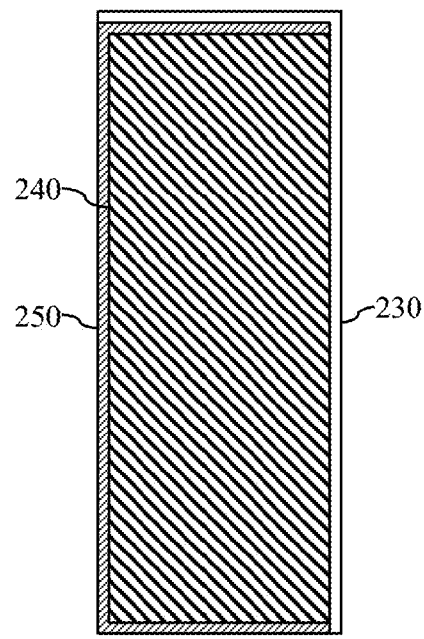
FIG. 3A is a schematic illustration of a top view of a submount.
Figure 3B:
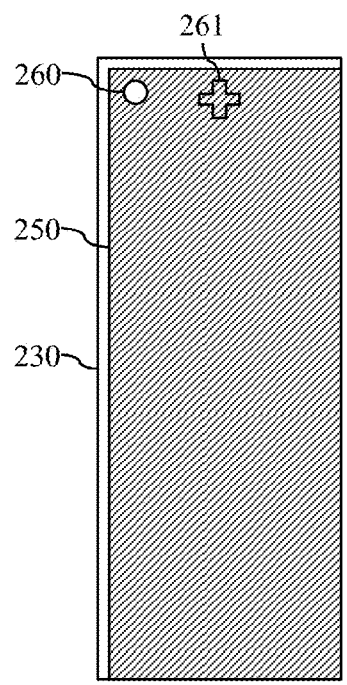
FIG. 3B is a schematic illustration of a bottom view of the submount of FIG. 3A.

With reference to FIGS. 2 and 3, the chip-scale package 200 of the present disclosure may include an edge-emitting semiconductor device chip 210, a top submount 220, and a bottom submount 230. The chip 210 may include a single edge-emitting semiconductor device. For example, the edge-emitting semiconductor device may be an edge-emitting laser diode or an edge-emitting light-emitting diode (LED). In operation, the chip 210 may emit an output beam from a front facet 211 of the chip 210.

The chip 210 may have a chip area, defined by a chip length $L_C$ and a chip width $W_C$, and a chip thickness $T_C$. For example, the chip length may be about 1000 µm, the chip width may be about 225 µm, and the chip thickness may be about 90 µm to about 140 µm. A top surface of the chip 210 and an opposite bottom surface of the chip 210 may each have the same chip area and may be separated by the chip thickness. The chip 210 may include an active layer, e.g., a p-n junction, substantially parallel to the top and bottom surfaces of the chip 210, between an n-type region, i.e., an n side, and a p-type region, i.e., a p side, of the chip 210. Typically, the top surface of the chip 210 may be an n-side surface, and the bottom surface of the chip 210 may be a p-side surface.

The top submount 220 may be disposed on the top surface of the chip 210, and the bottom submount 230 may be disposed on the bottom surface of the chip 210. In other words, the chip 210 may be sandwiched between the top submount 220 and the bottom submount 230, as shown in FIG. 2. The bottom submount 230, the chip 210, and the top submount 220 may be vertically stacked, i.e., stacked along a vertical axis of the chip-scale package 200.

Typically, the top submount 220 may be attached to the top surface of the chip 210 with solder 240, e.g., a gold-tin (AuSn) solder, and the bottom submount 230 may be attached to the bottom surface of the chip 210 with solder 240. A single-step reflow attachment process may be used to simultaneously attach the top submount 220 and the bottom submount 230 to the chip 210, allowing a high placement accuracy. The chip-scale package 200 may be fabricated by a chip-level process using singulated submounts 220 and 230 and chip 210.

In particular, the bottom submount 230 may be disposed so that the front facet 211 of the chip 210 overhangs the bottom submount 230, e.g., by about 5 µm to about 25 µm. The overhang 212 of the chip 210 may prevent the solder 240 from electrically shorting the p-n junction and/or blocking the front facet 211.

The top submount 220 and the bottom submount 230 may each be formed of a thermally conductive material, e.g., having a thermal conductivity of greater than about 200 W/m·K. Also, the top submount 220 and the bottom submount 230 may each be formed of a material having a coefficient of thermal expansion (CTE) that is substantially matched to a CTE of the chip 210, improving the reliability of the chip-scale package 200; e.g., the submounts 220 and 230 and the chip 210 may have CTEs of about 4 ppm/K to about 6 ppm/K. For example, the top submount 220 and the bottom submount 230 may each be formed of aluminum nitride (AlN), silicon carbide (SiC), or a copper-tungsten alloy (CuW), and the chip 210 may be based on gallium arsenide (GaAs).

In embodiments where the top submount 220 and the bottom submount 230 are formed of an electrically non-conductive material, e.g., aluminum nitride, they may be provided with wrap-around metallization 250, e.g., gold metallization, as shown in FIG. 2. The wrap-around metallization 250 may be formed on a top surface, a side surface, and a bottom surface of each submount 220 or 230. In embodiments where the top submount 220 and the bottom submount 230 are formed of an electrically conductive material, e.g., silicon carbide or a copper-tungsten alloy, the wrap-around metallization 250 may be omitted.

The top submount 220 may enable an electrical connection to the top surface of the chip 210, which may be a cathode of the chip 210, and the bottom submount 230 may enable an electrical connection to the bottom surface of the chip 210, which may be an anode of the chip 210. Advantageously, the top submount 220 and the bottom submount 230 may eliminate the need for wire bonds in the chip-scale package 200. The top submount 220 and the bottom submount 230 may also enable electrical connections to the chip 210 to be made during burn-in and testing without directly contacting the chip 210.

The top submount 220 and/or the bottom submount 230, as shown in FIG. 3, may have a notch 260 or fiducial mark 261 to facilitate alignment, e.g., by identifying the location of the output beam.

The top submount 220 may have a top-submount area, defined by a top-submount length $L_T$ and a top-submount width $W_T$, and a top-submount thickness $T_T$. For example, the top-submount length may be about 1110 µm, the top-submount width may be about 275 µm, and the top-submount thickness may be about 100 µm to about 300 µm, e.g., about 230 µm. Likewise, the bottom submount 230 may have a bottom-submount area, defined by a bottom-submount length $L_B$ and a bottom-submount width $W_B$, and a bottom-submount thickness $T_B$. For example, the bottom-submount length may be about 1100 µm, the bottom-submount width may be about 275 µm, and the bottom-submount thickness may be about 100 µm to about 300 µm, e.g., about 230 µm.

Typically, the top-submount thickness and the bottom-submount thickness may be substantially equal. The submount thicknesses may be selected on the basis of the ease of manufacturing, cost, reliability, and form factor. Typically, the submount thicknesses may be from about 100 µm to about 300 µm. Accordingly, a package height of the chip-scale package 200 may be less than or equal to about 1 mm, in some instances, less than or equal to about 300 µm. The directions of the chip thickness, the top-submount thickness, and the bottom-submount thickness may be substantially parallel to one another and to the vertical axis of the chip-scale package 200.

The top-submount area may be greater than or equal to the bottom-submount area. In some embodiments, the top-submount length may be greater than the bottom-submount length to allow the top submount 220 to overhang the front facet 211 of the chip 210, e.g., by about 5 µm to about 25 µm. The overhang 221 may provide mechanical protection for the front facet 211. Alternatively, the top-submount length and the bottom-submount length may be substantially equal. Typically, the top-submount width and the bottom-submount width may be substantially equal. The planes of the chip area, the top-submount area, and the bottom-submount area may be substantially parallel to one another and substantially perpendicular to the vertical axis of the chip-scale package 200.

The top-submount area and the bottom-submount area may each be greater than the chip area to account for pick-and-place accuracy during the reflow attachment process. For example, the submount lengths may be at least about 50 µm greater, e.g., about 100 µm greater, than the chip length, and the submount widths may be at least about 25 µm greater, e.g., about 50 µm, greater than the chip width.

Moreover, the top-submount area and the bottom-submount area may each be less than or equal to about 1.2 times the chip area. Accordingly, the package area of the chip-scale package 200, which may, typically, correspond to the top-submount area, may be less than or equal to 1.2 times the chip area. The package area of the chip-scale package 200 may be less than or equal to about 1 mm², in some instances, less than or equal to about 0.3 mm². The small package area may be particularly advantageous for mobile applications.

The chip-scale package 200 may be included in a semiconductor device assembly, which may also include a printed circuit board (PCB), a housing, an optical element, and/or other components. The chip-scale package 200 may be mounted on the PCB so that the top submount 220 and the bottom submount 230 are each electrically connected to the PCB. For example, the top submount 220 and the bottom submount 230 may each be electrically connected to the PCB through solder, conductive epoxy, a wire bond, or a metal clip. Typically, the chip-scale package 200 may be surface mounted on the PCB, i.e., attached by surface mount technology (SMT).

Figure 4A:
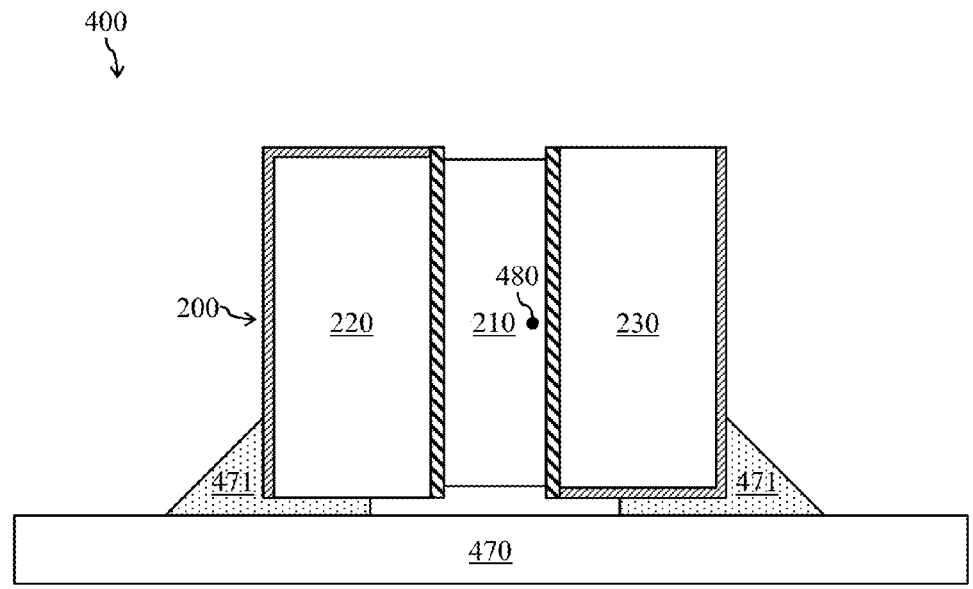
FIG. 4A is a schematic illustration of a front view of a semiconductor device assembly including a chip-scale package mounted horizontally on a printed circuit board (PCB) for emission parallel to the PCB.
Figure 4B:
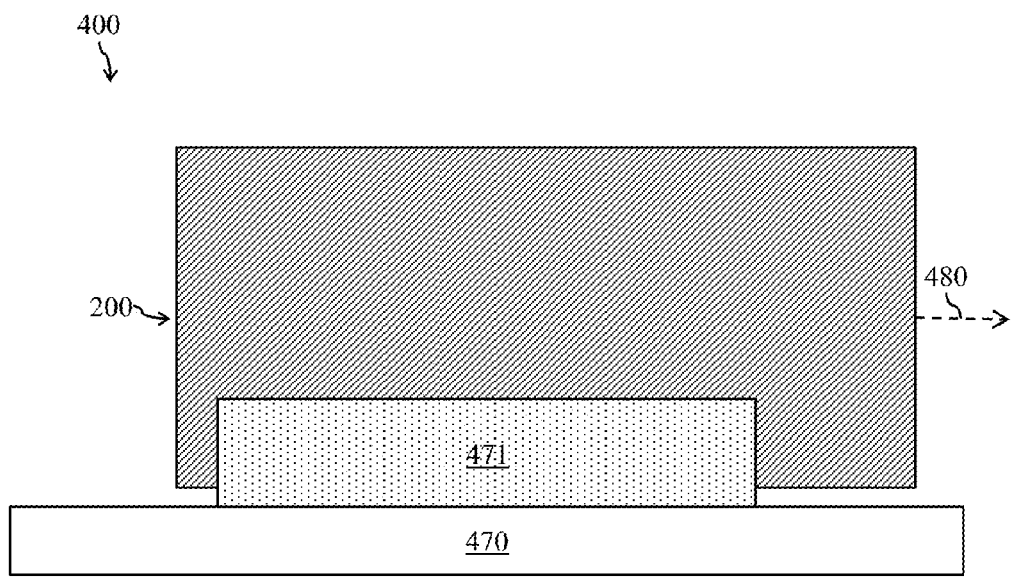
FIG. 4B is a schematic illustration of a side view of the semiconductor device assembly of FIG. 4A.

With reference to FIG. 4, in a first embodiment of a semiconductor device assembly 400, the chip-scale package 200 may be mounted horizontally on a PCB 470 for emission parallel to the PCB 470. In other words, the vertical axis of the chip-scale package 200 and the output beam 480 may each be parallel to the PCB 470. The top submount 220 and the bottom submount 230 may each be attached and electrically connected to the PCB 470 with solder 471 or conductive epoxy.

Figure 5:
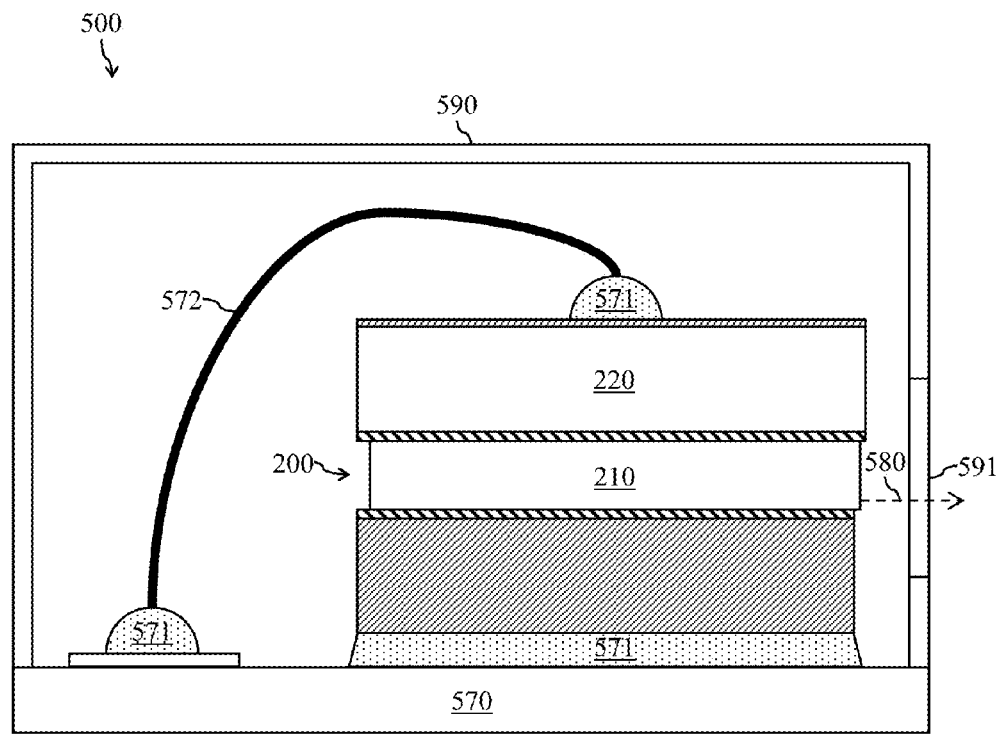
FIG. 5 is a schematic illustration of a side view of a semiconductor device assembly including a chip-scale package mounted vertically on a PCB for emission parallel to the PCB.

With reference to FIG. 5, in a second embodiment of a semiconductor device assembly 500, the chip-scale package 200 may be mounted vertically on a PCB 570 for emission parallel to the PCB 570. In other words, the vertical axis of the chip-scale package 200 may be perpendicular to the PCB 570, and the output beam 580 may be parallel to the PCB 570. The bottom submount 230 may be attached and electrically connected to the PCB 570 with solder 571 or conductive epoxy, and the top submount 220 may be electrically connected to the PCB 570 through a wire bond 572, e.g., formed in a post-SMT process, or a metal clip, e.g., formed in an SMT process, with solder 571 or conductive epoxy at both ends. The chip-scale package 200 and the PCB 570 may be covered with a protective housing 590, which may include an optical element 591, such as a lens, a diffuser, or a prism.

Figure 6:
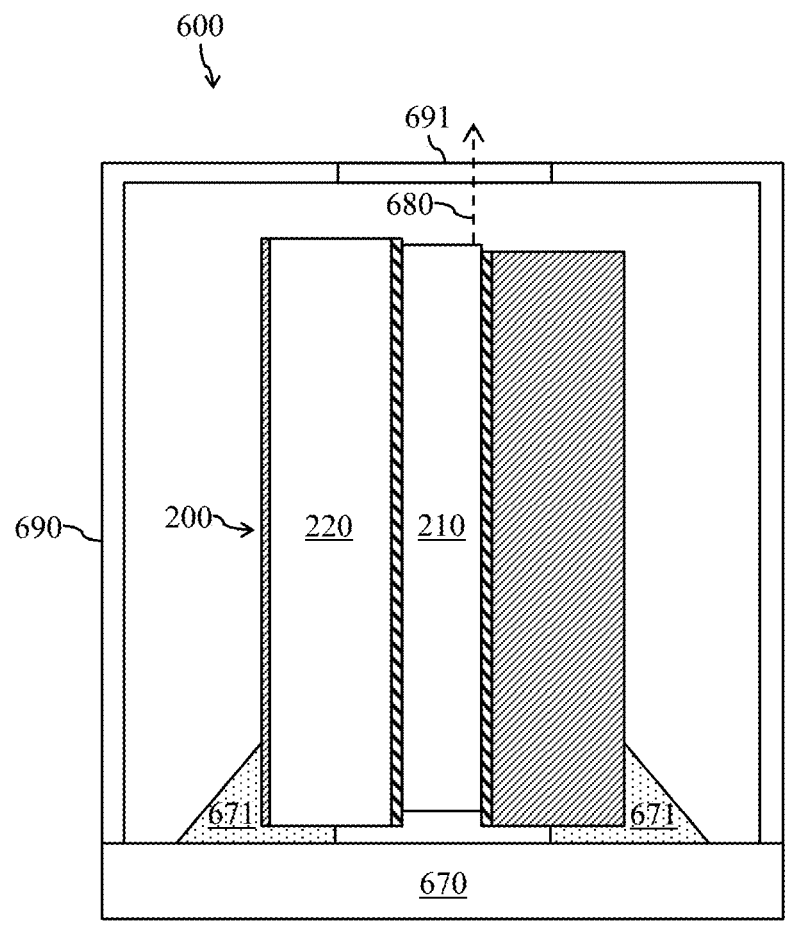
FIG. 6 is a schematic illustration of a side view of a semiconductor device assembly including a chip-scale package mounted horizontally on a PCB for emission perpendicular to the PCB.

With reference to FIG. 6, in a third embodiment of a semiconductor device assembly 600, the chip-scale package 200 may be mounted horizontally on a PCB 670 for emission parallel to the PCB 670. In other words, the vertical axis of the chip-scale package 200 may be parallel to the PCB 670, and the output beam 680 may be perpendicular to the PCB 670. The chip-scale package 200 and the PCB 670 may be covered with a protective housing 690, which may include an optical element 691, such as a lens, a diffuser, or a prism. The top submount 220 and the bottom submount 230 may each be attached and electrically connected to the PCB 670 with solder 671 or conductive epoxy.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

We claim:

1. A chip-scale package comprising:
    an edge-emitting semiconductor device chip, having a chip area, comprising a top surface and an opposite bottom surface;
    a top submount, having a top-submount area, disposed on the top surface of the edge-emitting semiconductor device chip; and
    a bottom submount, having a bottom-submount area, disposed on the bottom surface of the edge-emitting semiconductor device chip, wherein
    the top-submount area and the bottom-submount area are each greater than the chip area and less than or equal to about 1.2 times the chip area,
    a portion of the top submount overhangs a front facet of the edge-emitting semiconductor device chip and the bottom submount, and
    the front facet of the edge-emitting semiconductor device chip overhangs the bottom submount.

2. The chip-scale package of claim 1, wherein the edge-emitting semiconductor device chip includes a single edge-emitting semiconductor device.

3. The chip-scale package of claim 1, wherein the edge-emitting semiconductor device chip is an edge-emitting laser diode chip.

4. The chip-scale package of claim 1, wherein the top surface of the edge-emitting semiconductor device chip is an n-side surface, and the bottom surface of the edge-emitting semiconductor device chip is a p-side surface.

5. The chip-scale package of claim 1, wherein the top submount is attached to the top surface of the edge-emitting semiconductor device chip with solder, and wherein the bottom submount is attached to the bottom surface of the edge-emitting semiconductor device chip with solder.

6. The chip-scale package of claim 1, wherein the top submount and the bottom submount are each formed of a thermally conductive material having a coefficient of thermal expansion (CTE) that is substantially matched to a CTE of the edge-emitting semiconductor device chip.

7. The chip-scale package of claim 1, wherein the top submount and the bottom submount are each formed of aluminum nitride, silicon carbide, or a copper-tungsten alloy.

8. The chip-scale package of claim 1, wherein the top submount and the bottom submount are each formed of an electrically conductive material or are each provided with wrap-around metallization.

9. The chip-scale package of claim 1, wherein the top submount enables an electrical connection to a cathode of the edge-emitting semiconductor device chip, and the bottom submount enables an electrical connection to an anode of the edge-emitting semiconductor device chip.

10. The chip-scale package of claim 1, wherein the top-submount area is greater than or equal to the bottom-submount area and corresponds to a package area of the chip-scale package.

11. The chip-scale package of claim 10, wherein the package area is less than or equal to about 1 $mm^2$.

12. A semiconductor device assembly comprising:
    a chip-scale package comprising:
        an edge-emitting semiconductor device chip, having a chip area, comprising a top surface and an opposite bottom surface;
        a top submount, having a top-submount area, disposed on the top surface of the edge-emitting semiconductor device chip; and
        a bottom submount, having a bottom-submount area, disposed on the bottom surface of the edge-emitting semiconductor device chip, wherein
        the top-submount area and the bottom-submount area are each greater than the chip area and less than or equal to about 1.2 times the chip area,
        a portion of the top submount overhangs a front facet of the edge-emitting semiconductor device chip and the bottom submount, and
        the front facet of the edge-emitting semiconductor device chip overhangs the bottom submount; and
    a printed circuit board (PCB),
    wherein the chip-scale package is mounted on the PCB so that the top submount and the bottom submount are each electrically connected to the PCB.

13. The semiconductor device assembly of claim 12, wherein the chip-scale package is surface mounted on the PCB.

14. The semiconductor device assembly of claim 12, wherein the top submount and the bottom submount are each attached and electrically connected to the PCB with solder or conductive epoxy.

15. The semiconductor device assembly of claim 14, wherein the chip-scale package is mounted horizontally on the PCB for emission parallel to the PCB.

16. The semiconductor device assembly of claim 14, wherein the chip-scale package is mounted horizontally on the PCB for emission perpendicular to the PCB.

17. The semiconductor device assembly of claim 12, wherein the bottom submount is attached and electrically connected to the PCB with solder or conductive epoxy, and the top submount is connected to the PCB through a wire bond or a metal clip.

18. The semiconductor device assembly of claim 17, wherein the chip-scale package is mounted vertically on the PCB for emission parallel to the PCB.

19. The semiconductor device assembly of claim 12, wherein the top submount and the bottom submount are each formed of a thermally conductive material having a coefficient of thermal expansion (CTE) that is substantially matched to a CTE of the edge-emitting semiconductor device chip.

20. The semiconductor device assembly of claim 12, wherein the top submount enables an electrical connection to a cathode of the edge-emitting semiconductor device chip, and the bottom submount enables an electrical connection to an anode of the edge-emitting semiconductor device chip.

* * * * *